US011373695B2

(12) United States Patent
Swami et al.

(10) Patent No.: US 11,373,695 B2
(45) Date of Patent: Jun. 28, 2022

(54) MEMORY ACCESSING WITH AUTO-PRECHARGE

(71) Applicant: Micron Technology, Inc., Boise, ID (US)

(72) Inventors: Shivam Swami, Folsom, CA (US); Sean S. Eilert, Penryn, CA (US); Ameen D. Akel, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 98 days.

(21) Appl. No.: 16/719,907

(22) Filed: Dec. 18, 2019

(65) Prior Publication Data

US 2021/0193209 A1      Jun. 24, 2021

(51) Int. Cl.
*G11C 11/22* (2006.01)

(52) U.S. Cl.
CPC ........ *G11C 11/2259* (2013.01); *G11C 11/221* (2013.01); *G11C 11/2255* (2013.01); *G11C 11/2257* (2013.01); *G11C 11/2273* (2013.01); *G11C 11/2275* (2013.01); *G11C 11/2297* (2013.01)

(58) Field of Classification Search
CPC ............ G11C 11/2259; G11C 11/2273; G11C 11/2275; G11C 11/221; G11C 11/2257; G11C 11/2297; G11C 11/2255
See application file for complete search history.

(56) References Cited

U.S. PATENT DOCUMENTS

| 5,594,698 | A | * | 1/1997 | Freeman | .......... | H03K 19/17704 |
| | | | | | | 365/222 |
| 5,748,547 | A | * | 5/1998 | Shau | ................ | H01L 27/10829 |
| | | | | | | 365/222 |
| 5,877,990 | A | * | 3/1999 | Kim | .................... | G11C 7/1051 |
| | | | | | | 365/189.05 |
| 2003/0076725 | A1 | * | 4/2003 | Hush | .................... | G11C 11/406 |
| | | | | | | 365/222 |
| 2003/0218907 | A1 | * | 11/2003 | Yano | ................. | G11C 16/3454 |
| | | | | | | 365/185.03 |
| 2010/0211725 | A1 | * | 8/2010 | Nagashima | ......... | G06F 12/0893 |
| | | | | | | 711/103 |

(Continued)

FOREIGN PATENT DOCUMENTS

KR      20100055503 A      5/2010

OTHER PUBLICATIONS

ISA/KR, International Search Report and Written Opinion of the International Searching Authority, Int'l Appl. No. PCT/US2020/063414, dated Mar. 5, 2021, Korean Intellectual Property Office, Seo-gu, Daejeon, Republic of Korea, 9 pgs.

*Primary Examiner* — Jay W. Radke
(74) *Attorney, Agent, or Firm* — Holland & Hart LLP

(57) ABSTRACT

Methods, systems, and devices for memory accessing with auto-precharge are described. For example, a memory system may be configured to support an activate with auto-precharge command, which may be associated with a memory device opening a page of memory cells, latching respective logic states stored by the memory cells at a row buffer, writing logic states back to the page of memory cells, and maintaining the latched logic states at the row buffer (e.g., while maintaining power to latches of the row buffer, after closing the page of memory cells, while the page of memory cells is closed).

23 Claims, 8 Drawing Sheets

(56) References Cited

U.S. PATENT DOCUMENTS

2014/0071756 A1 3/2014 Iwai et al.
2014/0157065 A1 6/2014 Ong
2014/0254272 A1 9/2014 Sharon et al.
2018/0261266 A1 9/2018 Harris et al.

* cited by examiner

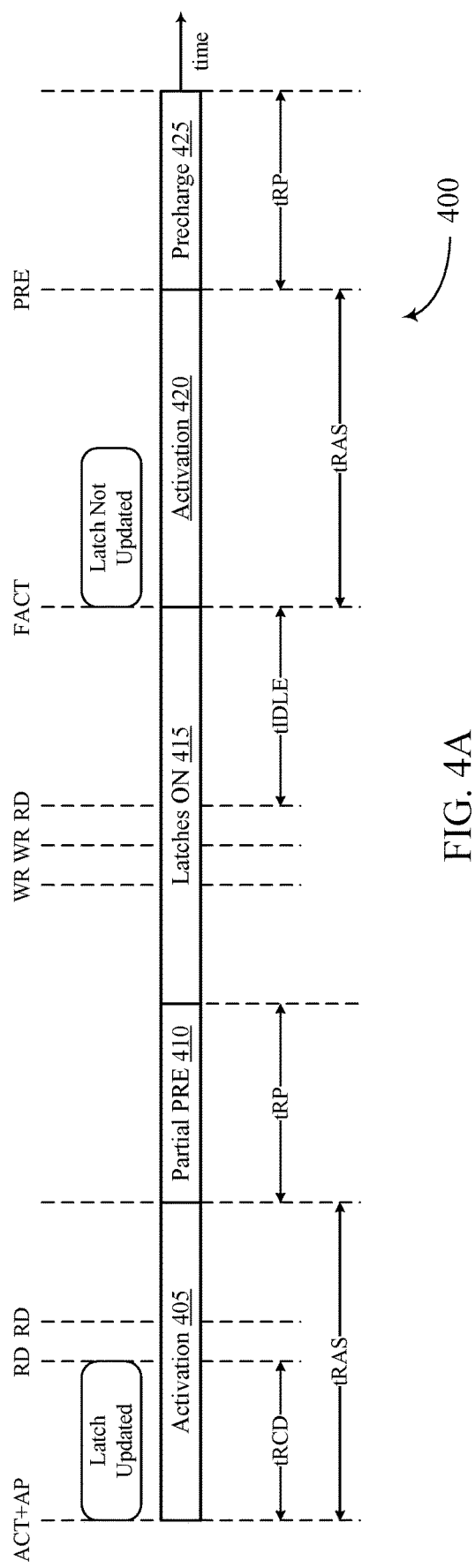
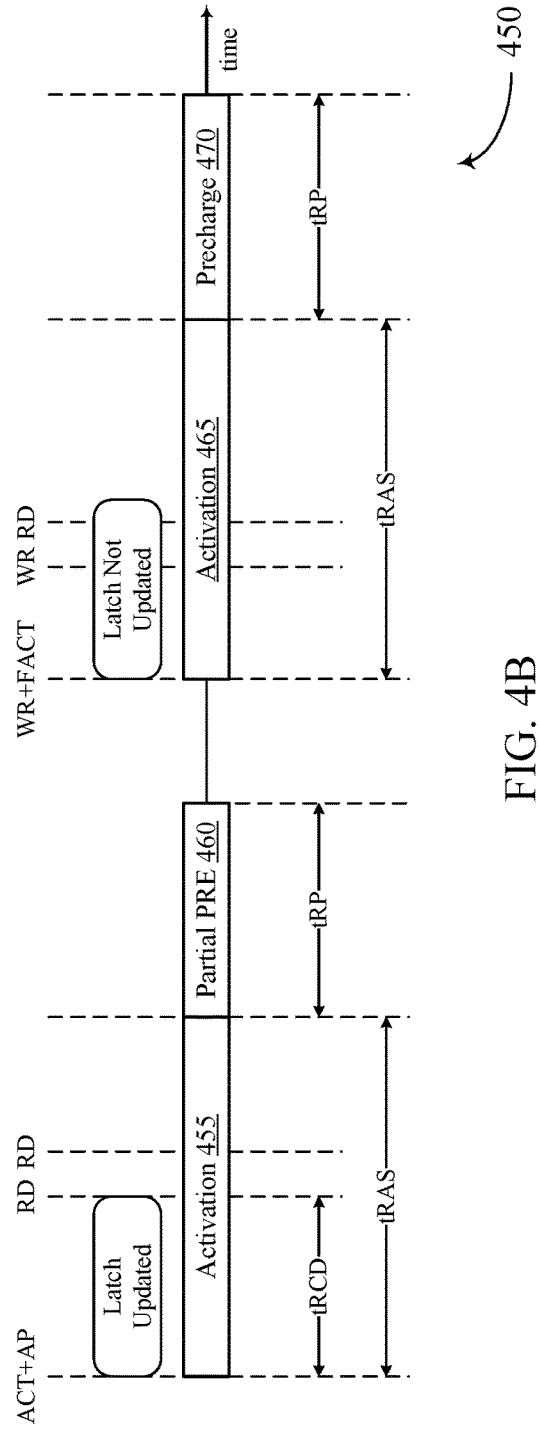
FIG. 4A
FIG. 4B

MEMORY ACCESSING WITH AUTO-PRECHARGE

BACKGROUND

The following relates generally to one or more memory systems and more specifically to memory accessing with auto-precharge.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

In some examples, a memory system may be configured such that a memory device accesses a memory array according to one or more access commands. Access commands sent to a memory device may be configured to correspond to different groups of operations performed by the memory device.

BRIEF DESCRIPTION OF THE DRAWINGS

FIGS. 4A and 4B illustrate examples of access timelines that support memory accessing with auto-precharge in accordance with examples as disclosed herein.

DETAILED DESCRIPTION

Figure 1:
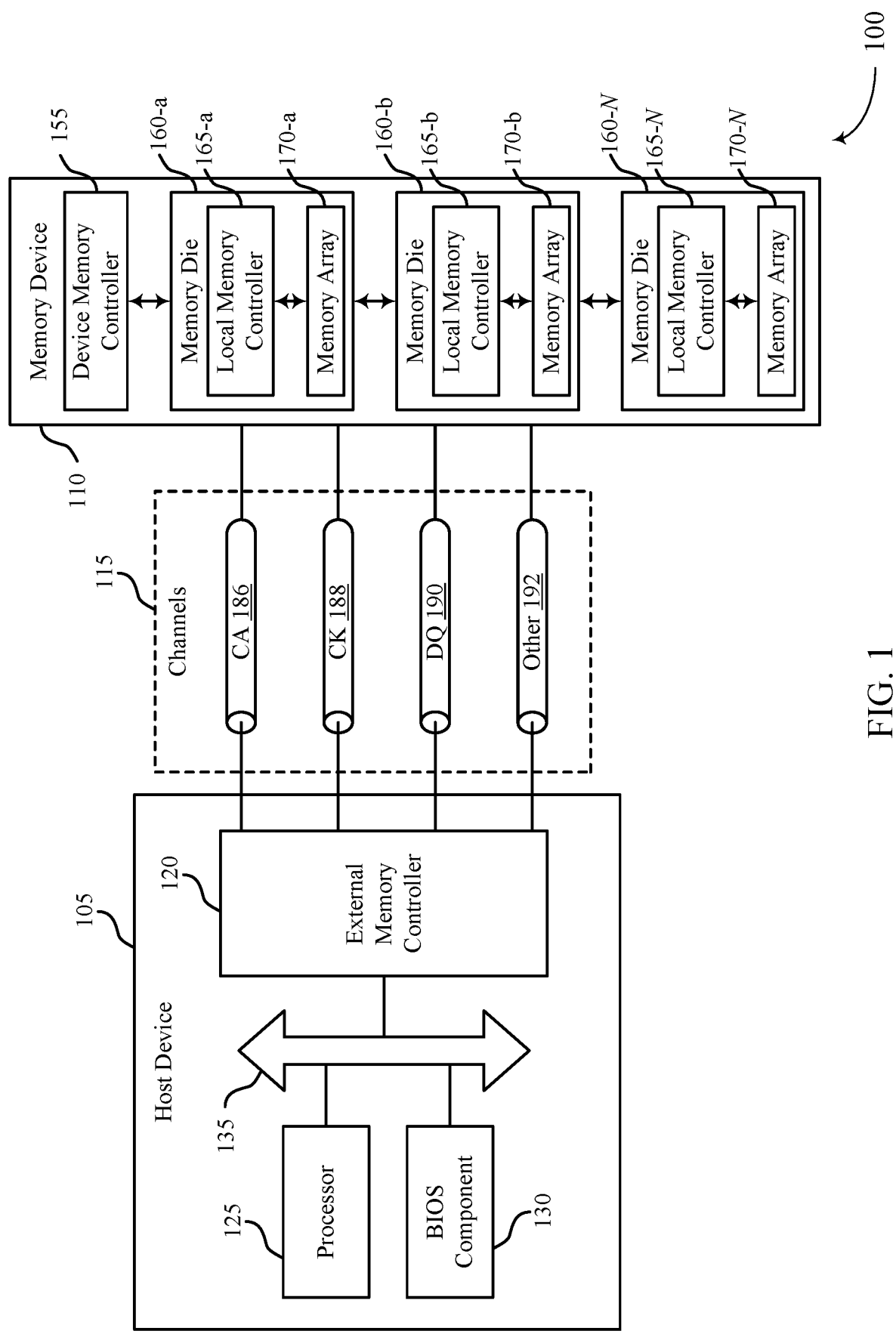
FIG. 1 illustrates an example of a system that supports memory accessing with auto-precharge in accordance with examples as disclosed herein.

Memory systems may be configured such that a memory device performs access operations on an array of memory cells according to one or more access commands, which may be received from a host device or other device. In some examples, access commands sent to a memory device may be configured to correspond to one or more different groups of operations performed by the memory device. For example, an activate command (e.g., an ACT command) may correspond to a memory device opening a page of memory cells and latching (e.g., at a row buffer, at sense amplifier latches) respective logic states stored by the memory cells while the page remains open. A read command (e.g., an RD command) may be issued to transfer information associated with one or more latched logic states, and a write command (e.g., a WR command) may be issued to update or modify latched logic states (e.g., updating or modifying information stored at a row buffer). In some examples, a precharge command (e.g., a PRE command) may correspond to writing logic states to the page of memory cells (e.g., from a row buffer), closing the page of memory cells, and removing power from the sense amplifier latches or row buffer.

In some circumstances, it may be advantageous to group memory device operations differently than a grouping according to an ACT command and a PRE command. For example, some applications or durations may be dominated by read-only activations, where an ACT command is followed by RD commands before the row is precharged (e.g., in response to a PRE command). For read-only activations, keeping a page open until all associated read commands are served may cause unnecessary power consumption, or may increase a duration or a latency associated with opening another page of memory cells (e.g., in a same bank of memory cells). Moreover, in some applications, a memory controller may issue speculative activation commands to proactively open pages of memory cells based on a predictive mechanism. However, if a prediction for opening a page or memory cells is incorrect, a speculative ACT command may not be followed by any RD command, and a page may be closed by issuing a PRE command. In such circumstances, a speculative ACT command may incur undue latency (e.g., associated with closing the speculatively opened page) before issuing a subsequent ACT command to the same bank, or may be otherwise associated with unnecessary bandwidth overhead.

In accordance with examples as disclosed herein, a memory system may be configured to support additional options for access commands, for example, providing different groupings of operations performed at a memory device. For example, a memory system may be configured to support an activate with auto-precharge (ACT+AP) command, which may be associated with a memory device opening a page of memory cells, latching respective logic states stored by the memory cells (e.g., at a row buffer, at sense amplifier latches), writing logic states back to the page of memory cells, and maintaining the latched logic states (e.g., while maintaining power to the row buffer or sense amplifier latches, after closing the page of memory cells, while the page of memory cells is closed). Thus, an ACT+AP command may be associated with aspects of both activation and precharge operations on a row in a memory bank. However, by maintaining power to a row buffer after precharge operations, the memory controller may continue to access the row buffer, which may contrast with operations or commands that turn off power to a row buffer after precharge operations. By supporting an ACT+AP command, and other related commands, a memory system may be associated with reduced latency, reduced command traffic, reduced power consumption, or reduced overhead (e.g., associated with speculative access operations) when compared with other access command schemes.

Features of the disclosure are initially described in the context of memory systems and dies as described with reference to FIGS. 1-2. Features of the disclosure are described in the context of a state diagram and corresponding access sequences as described with reference to FIGS. 3, 4A, and 4B. These and other features of the disclosure are further illustrated by and described with reference to an apparatus diagram and flowcharts that relate to memory accessing with auto-precharge as described with references to FIGS. 5-8.

FIG. 1 illustrates an example of a system 100 that supports memory accessing with auto-precharge in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate access commands between the host device 105 and the memory device 110, including control information associated with the commands (e.g., address information). For example, communication via the CA channel 186 may include a read command (e.g., an RD command) including or otherwise associated with an address of the desired data, or a write command (e.g., a WR command) including or otherwise associated with an address of data to be written. In some examples, a CA channel 186 may include any number of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

In some examples, the system 100 may be configured to support access commands (e.g., issued by the host device 105 or other device, to the memory device 110, over one or more CA channels 186) that correspond to different groups of operations performed by the memory device 110. For example, the host device 105 may issue an activate command (e.g., an ACT command), and the memory device 110 may respond by opening a page of memory cells (e.g., a row of memory cells) of a memory array 170 and latching (e.g., at a row buffer, at a set of sense amplifier latches) respective logic states stored by the memory cells while the page remains open. A read command (e.g., an RD command) may be issued to transfer information associated with latched logic states, and a write command (e.g., WR command) may be issued to update or modify latched logic states. In some examples, the host device 105 may issue a precharge command (e.g., a PRE command), and the memory device 110 may respond by writing logic states back to the page of memory cells, closing the page of memory cells, and removing power from the row buffer or sense amplifier latches.

In some circumstances, it may be advantageous to group memory device operations differently than a grouping according to an ACT command and a PRE command. For example, an access pattern or operational mode of the system 100 may be dominated by read-only activations, where an ACT command is followed by RD commands before a page is precharged (e.g., in response to a PRE command). For read-only activations, keeping a page open until all read commands are served may cause unnecessary power consumption at the memory device 110, or may increase a duration or a latency associated with opening another page of memory cells (e.g., in a same bank of memory cells). Moreover, in some applications, the host device 105 may issue speculative activation commands to proactively open pages of memory cells based on a predictive mechanism. However, if a prediction for opening a page or memory cells of the memory device 110 is incorrect, a speculative ACT command may not be followed by any RD command, and the page may be closed by issuing a PRE command. In such circumstances, a speculative ACT command may incur undue latency (e.g., associated with the memory device 110 closing the speculatively opened page) before issuing a subsequent ACT command to the same bank, or may be otherwise associated with unnecessary bandwidth overhead.

In accordance with examples as disclosed herein, the system 100 may be configured to support additional options for access commands, including different grouping of operations performed at the memory device 110. For example, the system 100 may be configured to support the host device 105 issuing an activate with auto-precharge (ACT+AP) command. In response to an ACT+AP command, the memory device 110 may open a page of memory cells, latch respective logic states stored by the memory cells (e.g., at a row buffer, at a set of sense amplifier latches), write logic states back to the page of memory cells, and maintain the latched logic states (e.g., while maintaining power to sense amplifier latches or row buffer, after closing the page of memory cells, while the page of memory cells is closed). Thus, an ACT+AP command may be associated with aspects of both activation and precharge operations on a row in a memory bank. However, when the memory device 110 maintains power to a row buffer after precharge operations, the memory device 110 or the host device 105 may continue to access the row buffer, which may contrast with operations or commands associated with the memory device 110 turning off power to a row buffer after precharge operations. By supporting an ACT+AP command, and other associated commands, operations of the system 100 may be associated with reduced latency, reduced command traffic, reduced power consumption, or reduced overhead (e.g., associated with speculative access operations) when compared with other access command schemes.

Figure 2:
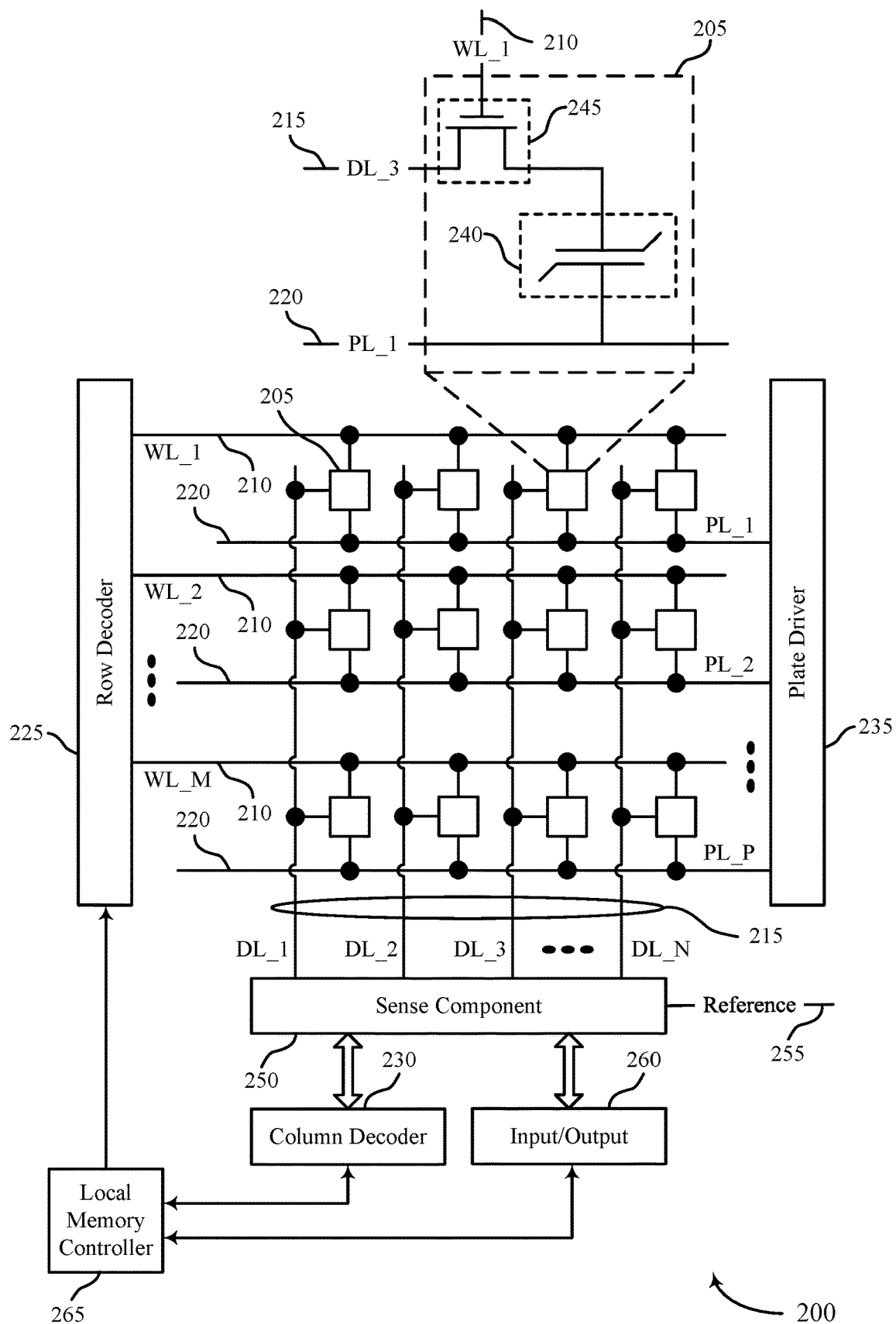
FIG. 2 illustrates an example of a memory die that supports memory accessing with auto-precharge in accordance with examples as disclosed herein.

FIG. 2 illustrates an example of a memory die 200 that supports memory accessing with auto-precharge in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

In some examples, the memory die 200 may be configured to respond to various access commands issued by a host device 105 or other device, where the various access commands may correspond to different groupings of operations performed by the memory die 200. For illustrative purposes, examples of memory operation groupings for respective access commands that may be supported by the memory die 200 in accordance with examples as disclosed herein are given by Table 1 below:

TABLE 1

Access Commands and Associated Memory Operation groupings

| | Select WL/DL/PL, Polarize Cells | Sense Cells, Latch Data | Write back data Deselect WL/DL/PL | Remove Power from Latches |
|---|---|---|---|---|
| ACT | ✓ | ✓ | | |
| PRE | | | ✓ | ✓ |
| ACT + AP | ✓ | ✓ | ✓ | |
| FACT | ✓ | | | |
| RPRE | ✓ | | ✓ | ✓ |
| DPRE | | | | ✓ |

A first example of an access command and associated memory operations that may be supported by the memory die 200 is illustrated in Table 1 as an ACT command. For example, in a first grouping of operations performed in response to an ACT command (e.g., the first column of operations of Table 1), the local memory controller 265 may be configured to open a row or page of memory cells 205, which may include selecting or activating a target word line 210 associated with the ACT command (e.g., an address of the ACT command, a row or page associated with the ACT command). In the first grouping of operations performed in response to an ACT command, the local memory controller 265 may also be configured to select or activate the set of digit lines 215 and the set of plate lines 220 associated with the ACT command (e.g., digit lines 215 and plate lines 220 corresponding to the page associated with the ACT command), which, in some examples, may be associated with applying a bias, such as a read bias, to the page of memory cells 205 (e.g., between the respective digit lines 215 and place lines 220). Such a biasing may be referred to as a polarizing of the page of memory cells 205, which may be associated with polarizing or otherwise setting all of the memory cells 205 of the page to a default logic state (e.g., a logic 0) as part of a signal generation for logic state detection.

In a second grouping of operations performed in response to an ACT command (e.g., the second column of operations of Table 1), the local memory controller 265 may be configured to sense the memory cells 205 of the page (e.g., at sense amplifiers of the sense component 250), which may refer to various examples of detecting the logic states stored at each of the memory cells 205 of the opened page. In the second grouping of operations performed in response to an ACT command, the local memory controller 265 may also be configured to latch the sensed data while the page of memory cells 205 remains open, which may include a latching at sense amplifier latches or a row buffer (e.g., of the sense component 250, of the I/O component 260), where, in some examples or configurations, references to sense amplifier latches and row buffers may be synonymous or otherwise operationally similar in accordance with examples as disclosed herein.

A second example of an access command and associated memory operations that may be supported by the memory die 200 is illustrated in Table 1 as a PRE command. For example, in a first grouping of operations performed in response to a PRE command (e.g., the third column of operations of Table 1), the local memory controller 265 may be configured to write logic states back to the page of memory cells 205, where such logic states may be sourced from the sense amplifier latches. In various examples, the logic states at the sense amplifier latches may be the same as those originally stored by the memory cells 205 (e.g., in a read-only activation, in a speculative activation that may or may not be followed by an RD command), or the logic states at the sense amplifier latches may be different than those originally stored by the memory cells 205 (e.g., in a write activation, in an activation followed by a WR command). In the first grouping of operations performed in response to a PRE command, the local memory controller 265 may also be configured to deselect or deactivate the target word line 210 associated with the ACT command (e.g., closing the row of memory cells 205), and deselect or deactivate the set of digit lines 215 and the set of plate lines 220 associated with the ACT command.

In a second grouping of operations performed in response to a PRE command (e.g., the third column of operations of Table 1), the local memory controller 265 may be configured to remove power from the latches (e.g., the sense amplifier latches, the row buffer). Accordingly, in response to a PRE command, row buffer data may be lost. In configurations of the memory die 200 that support an ACT+PRE access command sequence, a page of memory cells 205 may need to remain open to serve read and write commands (e.g., RD commands, WR commands), which may be required irrespective of whether the memory die 200 is operating according to an open page policy or closed page policy.

A third example of an access command and associated memory operations that may be supported by the memory die 200 is illustrated in Table 1 as an ACT+AP command, which may combine certain operations described with reference to an ACT command and a PRE command. For example, in response to an ACT+AP command, the local memory controller 265 may be configured to perform both the first and second grouping of operations described with reference to the ACT command, and perform the first grouping of operations described with reference to the PRE command (e.g., the first, second, and third columns of operations of Table 1). As a result, the local memory controller 265 may open the row of memory cells 205 to load its data in a row buffer, and then close the row without waiting for a separate precharge command. However, power to the row buffer may be maintained even after the grouped operations of the ACT+AP command, so that the local memory controller 265, or a device memory controller 155 or a host device 105, can continue to access the row buffer.

For example, in response to an ACT+AP command, the local memory controller 265 may be configured to open a page of memory cells 205, latch respective logic states stored by the memory cells 205 (e.g., at sense amplifier latches of the sense component 250 or I/O component 260), write logic states back to the page of memory cells 205, and maintain the latched logic states at the row buffer (e.g., while maintaining power to the latches, after closing the page of memory cells, while the page of memory cells is closed). When the memory die 200 maintains power to the latches after precharge operations, the local memory controller 265, or a device memory controller 155 or a host device 105, can continue to access the latches, which may contrast with operations or commands associated with the memory die 200 turning off power to the latches after precharge operations. Thus, the ACT+AP command may be associated with activating and precharging a memory bank with a single command, where a memory bank may retain data in a row or page buffer even after the operations associated with the ACT+AP command. In some examples, an ACT+AP command may include or be otherwise associated with a bank address, a row address, and an auto-precharge flag (e.g., a 1-bit auto-precharge flag).

In some examples, the ACT+AP command may be supported by configurations of sense amplifiers and sense amplifier latches. For example, to support ACT+AP commands, the memory die 200 may be configured in a manner where sense amplifiers (e.g., of the sense component 250) are able to be decoupled from sense amplifier latches or row buffer components (e.g., of the sense component 250 or the I/O component 260) that serve I/O requests such as RD commands or WR commands. Thus, the memory die 200 may be configured such that a row buffer can continue to serve RD and WR requests after the grouped operations of an ACT+AP command, where a row associated with the ACT+AP command may be closed.

In some examples, supporting ACT+AP commands may combine benefits of open and closed page policies. For example, when performing read-only activations, a page can be closed relatively earlier, like in a closed page policy, which may prepare for a subsequent page activation and reduce power consumption. Such an approach may also support a reduction of row-closing latency during bank conflict, like in a closed page policy. Moreover memory requests serviced by row buffer may be supported by relatively lower latency, like in an open page policy.

A fourth example of an access command and associated memory operations that may be supported by the memory die 200 is illustrated in Table 1 as a FACT command (e.g., a fake activate command), which may be associated with a subset of operations described with reference to an ACT command (e.g., the first column of operations of Table 1). In response to a FACT command, the local memory controller 265 may open a row of memory cells 205 (e.g., selecting or activating a word line 210 and associated digit lines 215 and plate lines 220), but data from memory cells 205 may not be sensed by sense amplifiers of the sense component 250. Further, in response to a FACT command, data from the row of memory cells 205 may not be latched in a row buffer. However, similar to an ACT command, a FACT command may be associated with resetting the memory cells 205 of the activated row to a default logic stage (e.g., a logic 0 or any other programmable state based on the memory cell technology). Thus, one purpose of a FACT command may be to set up a page of memory cells 205 to be written with contents of SA latches, which may support a row of memory cells 205 being ready for programming without altering a row buffer. For example, when a FACT command is followed by a PRE command, content of a row buffer may be transferred to the row or memory cells. Thus, in response to a FACT command, a page may be opened, but data in latches may not be overwritten. In some examples, a FACT command may include or be otherwise associated with a bank address, a row address, and an isolation flag (e.g., a 1-bit isolation flag).

A fifth example of an access command and associated memory operations that may be supported by the memory die 200 is illustrated in Table 1 as an RPRE command, which may combine certain operations described with reference to an ACT command and a PRE command. For example, in response to an RPRE command, the local memory controller 265 may be configured to perform the first grouping of operations described with reference to the ACT command, and perform both the first grouping and second grouping of operations described with reference to the PRE command (e.g., the first, third, and fourth columns of operations of Table 1). In some examples, an RPRE command may be referred to as a precharge command that internally invokes a FACT command (e.g., an ACT command without sensing or updating the latches) followed by a precharge (e.g., operations associated with a PRE command).

For example, in response to an RPRE command, the local memory controller 265 may be configured to first perform memory operations associated with a FACT command and then perform operations associated with a PRE command on the designated row of memory cells 205, which may require the row address to be specified (e.g., accompanying or otherwise included the RPRE command). In some examples, the RPRE command may be considered as a modification to conventional PRE command, which may only require a bank address and does not invoke a FACT command internally. In response to an RPRE command, data that was in a row buffer (e.g., from a previous sense or write operation) may be written to the memory cells 205 of the associated page, and the page may be closed.

A sixth example of an access command and associated memory operations that may be supported by the memory die 200 is illustrated in Table 1 as a DPRE command (e.g., a dummy precharge command), which may be associated with a subset of operations described with reference to a PRE command (e.g., the fourth column of operations of Table 1). For example, in response to a DPRE command, the local memory controller 265 may be configured to power down or otherwise remove power from latches (e.g., powering down or removing power from a row buffer or sense amplifier latches). Support of such a command may accompany the support of the ACT+AP command, since a row buffer may remain powered on even after a precharge operation associated with the ACT+AP command. In other words, a DPRE command may be used to provide an explicit row buffer power down command. In some examples, a DPRE command may be issued when a bank is idle for a predefined duration (e.g., tIDLE), or some other threshold amount of time after ACT+AP (e.g., tRAS). In some examples, DPRE commands may be issued only to a partially precharged bank. In some examples, a DPRE command may include or be otherwise associated with a bank address, but may not include or be associated with a given row address.

By including support for ACT+AP commands, and associated FACT, RPRE, and DPRE commands (e.g., an ACT+AP access paradigm), various access applications may be supported with improved performance compared to access paradigms that are limited to ACT and PRE commands (e.g., an ACT/PRE access paradigm). For example, by issuing a single command that includes aspects of activating and precharging a page, an ACT+AP paradigm may reduce latency of opening and closing a row (e.g., a duration of a time to close a row, tRC), or may reduce memory command traffic, among other benefits.

In some examples for applying an ACT+AP paradigm, access commands may be beneficially combined to support a read-only access cycle (e.g., an ACT+AP>RD>DPRE sequence of commands). For example, in some applications, a majority of page activations may be read-only activates (e.g., an activation followed by only RD commands before a row is precharged), and keeping a row open until every read is served may incur unnecessary power consumption, or may increase an activation time of the next row access in the same bank (e.g., related to the duration of row precharge in various memory architectures). Moreover, some memory systems may include speculative activations (e.g., prefetchers) to proactively open rows in memory banks based on a predictive mechanism. However, if a prediction is wrong, a speculative activation may not be followed by any read command and the row may need to be closed by issuing a precharge command. In such scenarios, a speculative activation may incur row closing latency for a subsequent activation command to the same bank.

An ACT+AP access paradigm may be beneficial for these and other read-only access cycles since it may not incur row closing latency. Rather, an ACT+AP paradigm may support closing a row of memory cells 205 as soon as practicable, while still supporting access to the data while the row is closed. Such an approach may be effective for longer pages, or supporting an open-page paradigm. Such an approach may also provide additional opportunities to access information, like a cache, without reopening a page. Moreover, such an approach may beneficially support speculative access in a second bank while working in a first bank, or when CPU limited. If a speculative access makes a correct guess, access to data may be relatively quick, whereas if a speculative access makes an incorrect guess, a precharge latency penalty in a subsequent access may be avoided.

In some examples for applying an ACT+AP paradigm, access commands may be beneficially combined to support a row copy access cycle. For example, row copy operations according to an ACT/PRE paradigm may incur high memory bandwidth and latency to transfer data back and forth between a memory device 110 and a host device 105. Using the commands of an ACT+AP paradigm, row copy operations may be executed more efficiently without incurring such latency and memory traffic. For example, an ACT+AP command may be issued for a source page (e.g., to load the content of a source row into the row buffer), and an RPRE command may be issued for a destination page (e.g., to update the destination row with the content of the row buffer). Such an approach may reduce power consumption, bandwidth, and latency of bringing data out of a page and putting data back into a page, as compared with an ACT/PRE paradigm.

In some examples for applying an ACT+AP paradigm, access commands may be beneficially combined to support a row copy with modification. For example, an ACT+AP command may be issued for a source page (e.g., to load the content of a source row into the row buffer), a WR command may be issued to modify data (e.g., as stored at the row buffer), and an RPRE command may be issued for a destination page (e.g., to update the destination row with the modified row buffer content). Such an approach may reduce power consumption, bandwidth, and latency of bringing data out of a page and putting data back into a page, as compared with an ACT/PRE paradigm, when overwriting part of the page.

In some examples for applying an ACT+AP paradigm, access commands may be beneficially combined to support writing a row with a default logic state (e.g., erasing a row, overwriting a row, resetting a row, writing all memory cells 205 of a row to a logic 0), which may be associated with secure deallocation of memory. For example, writing a default logic state such as a logic 0 may be performed when a new process is allocated memory pages that were previously occupied by another process. Writing a default logic states to pages may be an operating system security service to ensure that the data from the previous process is not accessible to the new process. In some applications, the operating system may write zeros to the memory pages of the old process, which may incur latency and bandwidth overhead (e.g., associated with an ACT/PRE paradigm).

To perform a secure deallocation of a page under an ACT+PRE paradigm, a FACT command may be issued for the page to open the page and reset the logic states of the memory cells 205 of the page (e.g., to zero out a memory row), which may obviate the need to issue explicit write commands (e.g., with all-zero data). Such an approach may reduce power consumption, bandwidth, and latency associated with writing the default logic state. In some examples, a modified FACT command (e.g., a FACT command accompanied by one or more modification or configuration flag bits) may be issued, which may be interpreted by a memory device to perform operations associated with a FACT+Row Buffer Zeroing+PRE combination. A modified FACT command may be associated with setting memory cells of a row to a default logic state as well as removing power or otherwise deactivating an associated word line, plate line, digit line, or latches.

In some cases, a DPRE command may save power in scenarios where a row buffer is left powered on (e.g., after precharge), or when it is uncertain whether row buffer content may be required in the future. In such scenarios, a DPRE command may be used to turn off the power in the latches (e.g., row buffer).

The access commands illustrated in Table 1 may be selectively applied in various scenarios and configurations. For example, a memory system (e.g., system 100) may be configured to support all of the access commands illustrated in Table 1, and devices of such a system may operate under different access paradigms, such as one or both of an ACT/PRE paradigm or an ACT+AP paradigm. For example, a memory system may operate according to an ACT/PRE sequence in some scenarios, and according to an ACT+AP sequence in some scenarios. Such paradigms may be selected based on a static configuration (e.g., defined in a manufacturing or assembly operation), such that a host device 105 or a memory device 110 always operates according to an ACT/PRE paradigm, or always operates according to an ACT+AP paradigm. In other examples, a host device 105 or a memory device 110 may perform a selection based on various operating conditions, such as access or latency parameters, power consumption or availability parameters, data pattern parameters, and other conditions. Thus, in some examples, a host device 105 or a memory device 110 may operate according to an ACT/PRE paradigm in some conditions, and according to an ACT+AP paradigm in others.

Figure 3:
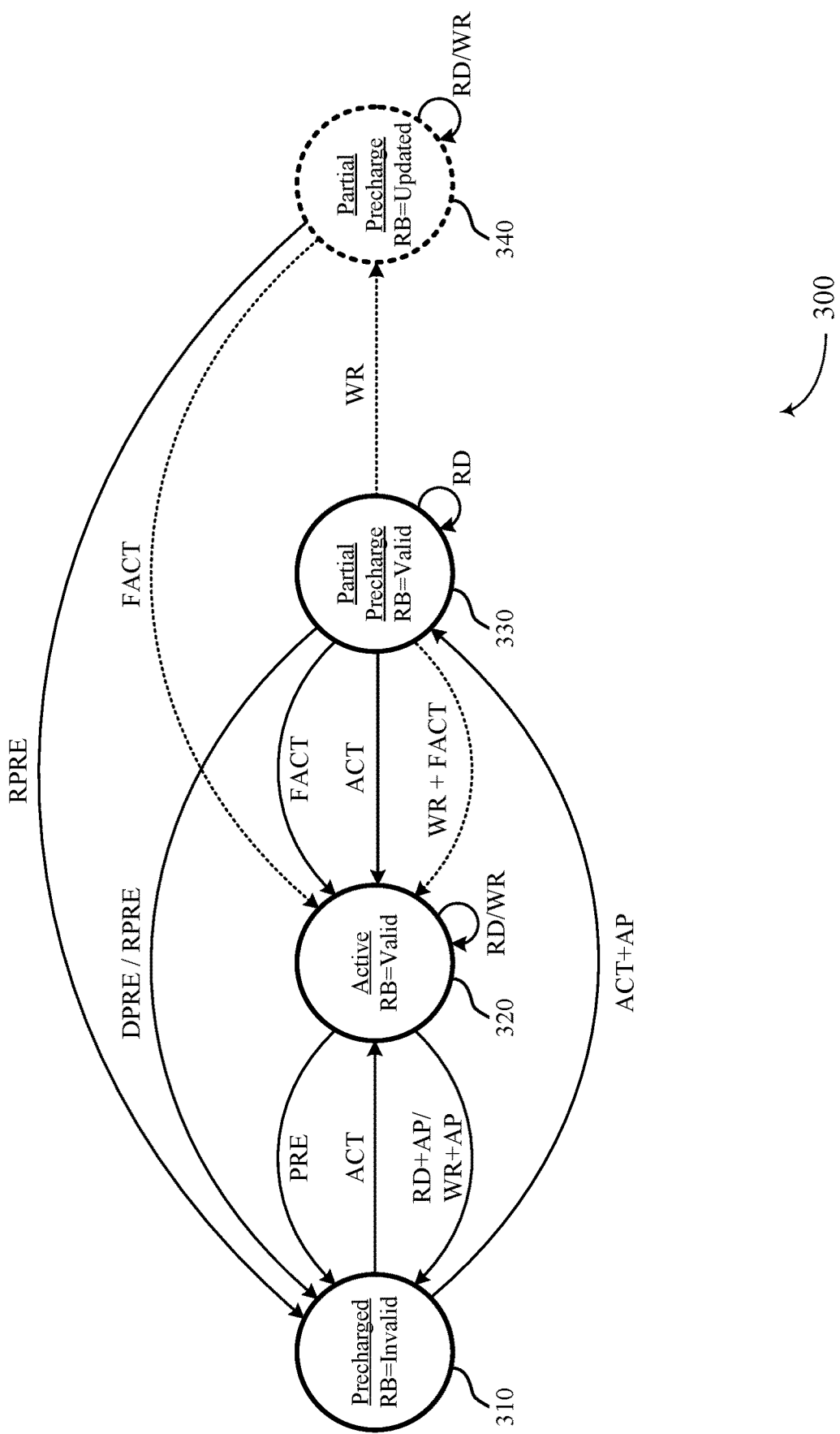
FIG. 3 illustrates an example of a state diagram and associated access commands that support memory accessing with auto-precharge in accordance with examples as disclosed herein.

FIG. 3 illustrates an example of a state diagram 300 and associated access commands that support memory accessing with auto-precharge in accordance with examples as disclosed herein. For example, the state diagram 300 may be illustrative of states and transitional access commands associated with one or both of an ACT/PRE access paradigm or an ACT+AP access paradigm. Each of the illustrated states may be associated with a bank status and a row buffer status, among other conditions or parameters.

A first state 310 may illustrate a state where a bank of memory cells 205 is precharged, and information of an associated row buffer is invalid. For example, in the first state 310, the memory cells 205 of the bank may each store or otherwise maintain a respective logic state, and the rows of the bank may all be closed. Further, in the first state 310, the row buffer may be powered down, such that the row buffer does not maintain meaningful data. In some examples, the first state 310 may be an idle or default operating condition (e.g., between activations of the memory bank).

A second state 320 may illustrate a state where a bank of memory cells 205 is active, and information of an associated row buffer is valid. For example, in the second state 320, a row of the bank may be opened, which may include an activation of an associated word line 210, or an activation of one or more associated digit lines 215 or plate lines 220 of the bank. The memory cells 205 of the opened row may not store meaningful data (e.g., may be biased or polarized to a default logic state, such as a logic 0). Other memory cells 205 of the bank (e.g., of closed rows of the bank) may still store or maintain respective logic states. Further, in the second state 320, the row buffer may be powered up, such that the row buffer may maintain meaningful data.

A third state 330 may illustrate a state where a bank of memory cells 205 is partially precharged, and information of an associated row buffer is valid. For example, in the third state 330, all the rows of the bank may be closed, such that all of the memory cells 205 may store or maintain meaningful data. Further, in the third state 330, the row buffer may be powered up, such that the row buffer may maintain meaningful data.

In various examples, the state diagram 300 may or may not include a fourth state 340. The fourth state 340 may illustrate a state where a bank of memory cells 205 is partially precharged, and information of an associated row buffer is updated. For example, in the fourth state 340, all the rows of the bank may be closed, such that all of the memory cells 205 may store or maintain meaningful data. Further, in the fourth state 340, the row buffer may be powered up, such that the row buffer may maintain meaningful data. However, in the example of the fourth state 340, information of the row buffer may have been updated (e.g., according to a write command).

In an ACT/PRE access paradigm, a memory device 110, or portions thereof (e.g., a memory die 200), may alternate between the first state 310 and the second state 320. For example, from the first state 310, the memory device 110 may receive an ACT command that triggers a transition to the second state 320, where a bank is activated (e.g., with an opened row) and a row buffer is powered on and valid. In the second state 320, the memory device 110 may be responsive to RD commands by providing data from the row buffer, and may be responsive to WR commands by modifying or updating data of the row buffer. The memory device 110 may transition back to the first state 310 in response to a PRE command, which may be associated with writing the information of the row buffer to the opened row, and then closing the row. However, such an access paradigm may be associated with unnecessary power consumption in the second state 320 while maintaining the row in the opened state, or may be associated with a row closing latency as part of the transition from the second state 320 to the first state 310.

In an ACT+AP access paradigm, a memory device 110, or portions thereof, may alternate between the first state 310, the second state 320, the third state 330, and, when included, the fourth state 340. For example, from the first state 310, the memory device 110 may receive an ACT+AP command that triggers a transition to the third state 330, where a bank is activated temporarily to load information from an opened row into a row buffer, and the bank is subsequently deactivated (e.g., partially precharged) while the row buffer remains powered on and valid. Thus, in the third state 330, the row buffer may continue to serve read requests after ACT+AP until a subsequent activation.

In the third state 330, the memory device 110 may be responsive to RD commands by providing data from the row buffer. Further, in the third state 330, the memory device 110 may be responsive to a FACT command by transitioning from the third state 330 to the second state 320, where the bank is activated (e.g., with an opened row, to support write-back of latched data) and a row buffer remains powered on and valid. In the second state 320, the memory device 110 may be responsive to other commands, such as a combination RD+AP command or a combination WR+AP command, by transitioning from the second state 320 to the first state 310. In such examples, the memory device 110 may first respond to the associated RD or WR command, and then perform an auto-precharge to write back data to the cells and deselect an associated word line (e.g., close the active row) and deselect associated digit lines and plate lines.

In the third state 330, the memory device 110 may also be responsive to a DPRE command or an RPRE command (e.g., a FACT+PRE command) by transitioning from the third state 330 to the first state 310, where the bank is deactivated and power is removed from the row buffer, thereby invalidating the row buffer. In some examples, such a direct transition (e.g., to the first state 310) may avoid latency associated with reactivating the bank (e.g., via the second state 320). In some examples, a DPRE command may be issued after a duration has passed since a preceding ACT+AP command, or some duration of being in the third state 330, such as a duration associated with a row activation (e.g., tRAS).

An ACT+AP access paradigm may support row buffer updating according to various configurations, which may be handled using specialized commands. In some examples (e.g., when the fourth state 340 is included), the memory device 110 in the third state 330 may be responsive to a WR command by transitioning from the third state 330 to the fourth state 340 and updating the information of the row buffer. In the fourth state 340, the memory device 110 may be responsive to RD commands by providing updated data from the row buffer, and may be responsive to WR commands by further modifying or updating data of the row buffer. In the fourth state 340, the memory device 110 may be responsive to a FACT command by transitioning from the fourth state 340 to the second state 320, where the bank is activated (e.g., with an opened row, to support write-back of the updated data) and a row buffer remains powered on and valid. In the fourth state 340, the memory device 110 may also be responsive to an RPRE command (e.g., a FACT+PRE command) by transitioning from the fourth state 340 to the first state 310, where the bank is deactivated and power is removed from the row buffer, thereby invalidating the row buffer. In some examples (e.g., when the fourth state 340 is not included), the memory device 110 in the third state may be responsive to a combination WR+FACT command by transitioning from the third state 330 to the second state 320, where the bank is activated (e.g., with an opened row, to support write-back of the updated data) and a row buffer remains powered on and valid.

In the ACT+AP access paradigm, the memory device 110 in the second state 320 may also be responsive to RD commands by providing data from the row buffer, and may be responsive to WR commands by modifying or updating data of the row buffer. The memory device 110 may also transition back to the first state 310 in response to a PRE command, which may be associated with writing the information of the row buffer to the opened row, and then closing the row.

FIGS. 4A and 4B illustrate examples of access timelines 400 and 450, respectively, that support memory accessing with auto-precharge in accordance with examples as disclosed herein. Each of the access timelines 400 and 450 illustrate different operational states of a memory device 110 with respect to access commands and associated durations, which may be associated with various timing constraints. The access timelines 400 and 450 may illustrate different options for issuing a FACT command to activate a row of memory cells 205 without updating a row buffer. For example, the access timeline 400 may be illustrative of an access ACT+AP access paradigm that includes the fourth state 340 of the state diagram 300, and the access timeline 450 may be illustrative of an ACT+AP access paradigm that does not include the fourth state 340 of the state diagram 300.

In both the access timeline 400 and the access timeline 450, the memory device 110 may start in a standby state, which may correspond to the first state 310 of the state diagram 300. In each case, the memory device 110 may be issued an ACT+AP command, which may include an initial activation of a bank (e.g., Activation 405 of access timeline 400, Activation 455 of access timeline 450). The respective initial activations may include a duration, tRCD, which may correspond to a row address to column address delay or duration over which a latch (e.g., row buffer) is updated with information from the opened row. In some examples, tRCD may correspond to a minimum duration before accessing a memory cell 205 or digit line 215 of the opened row. After such a duration, the memory device 110 may support accessing the information from the latch, such as an accessing in response to issued RD commands.

Further, in both the access timeline and the access timeline 450, the memory device 110 may transition from the respective initial activation condition to a respective partial precharge condition (e.g., Partial PRE 410 of access timeline 400, Partial PRE 460 of access timeline 450). Such a transition may occur after a duration, tRAS, which may correspond to a row active time. In some examples, tRAS may correspond to a minimum duration that a row needs to be open to ensure access to the information. During the respective partial precharge conditions, information may be written back to the memory cells 205 of the opened row. Such operations may be associated with a duration, tRP, which may correspond to a write-back delay or duration.

In the example of access timeline 400, the partial precharge condition may be followed by a Latches ON condition 415, over which RD and WR commands may be serviced by information stored in the row buffer of the memory device 110 (e.g., while operating in the third state 330 of the state diagram 300). Upon receiving a WR command, the memory device 110 may transition to the fourth state 340 of the state diagram, corresponding to the updated row buffer status. A FACT command may be issued to transition to a new activation state (e.g., Activation 420 of the access timeline 400, a transition from the fourth state 340 to the second state 320 of the state diagram 300), which may occur some duration after another access command (e.g., a duration, tIDLE, after an RD command). In some examples, the new activation state, or the issuance of the FACT command, may satisfy a threshold duration between bank activations (e.g., a duration, tFAW, between Activation 405 and Activation 420 or between the ACT+AP command and the FACT command).

During the new activation state of access timeline 400, a row may be opened (e.g., a same row as opened during the activation 405, a row different than the one opened during the activation 405), but the latch may not be updated. Rather, the FACT command may prepare the corresponding row for writing with the updated information stored in the latches during the Latches ON period, which may also be associated with the duration tRAS. Following a PRE command (e.g., initiating a transition from the second state 320 to the first state 310 of the state diagram 300), the information may be written from the latches to the opened row, and the row may be closed, which may also be associated with the duration tRP.

In the example of access timeline 450, the memory device 110 may be configured to await (e.g., in the third state 330 of the state diagram 300) a combination WR+FACT command after the partial precharge condition. The WR+FACT command may be issued to transition to a new activation state (e.g., Activation 465 of the access timeline 450, a transition from the third state 330 to the second state 320 of the state diagram 300). During the new activation state, a row may be opened (e.g., a same row as opened during the activation 405, a row different than the one opened during the activation 405), but the latch may not be updated. Rather, the WR+FACT command may prepare the corresponding row for writing with the updated information associated with the WR portion of the combined command, which may also be associated with the duration tRAS. In some examples, the new activation state, or the issuance of the WR+FACT command, may satisfy a threshold duration between bank activations (e.g., a duration, tFAW, between Activation 455 and Activation 465 or between the ACT+AP command and the WR+FACT command).

During the new activation state of the access timeline 450, further WR commands, or RD commands, may be serviced by information stored in the row buffer of the memory device 110 (e.g., while operating in or transitioning to the second state 320 of the state diagram 300). Following a PRE command (e.g., initiating a transition from the second state 320 to the first state 310 of the state diagram 300), the information may be written from the latches to the opened row, and the row may be closed, which may also be associated with the duration tRP. In some examples, the access timeline 450, corresponding to an ACT+AP access paradigm that omits the fourth state 340 of the state diagram 300, may be associated with reduced overhead compared with the access timeline 400, corresponding to an ACT+AP access paradigm that includes the fourth state 340 of the state diagram 300.

Figure 5:
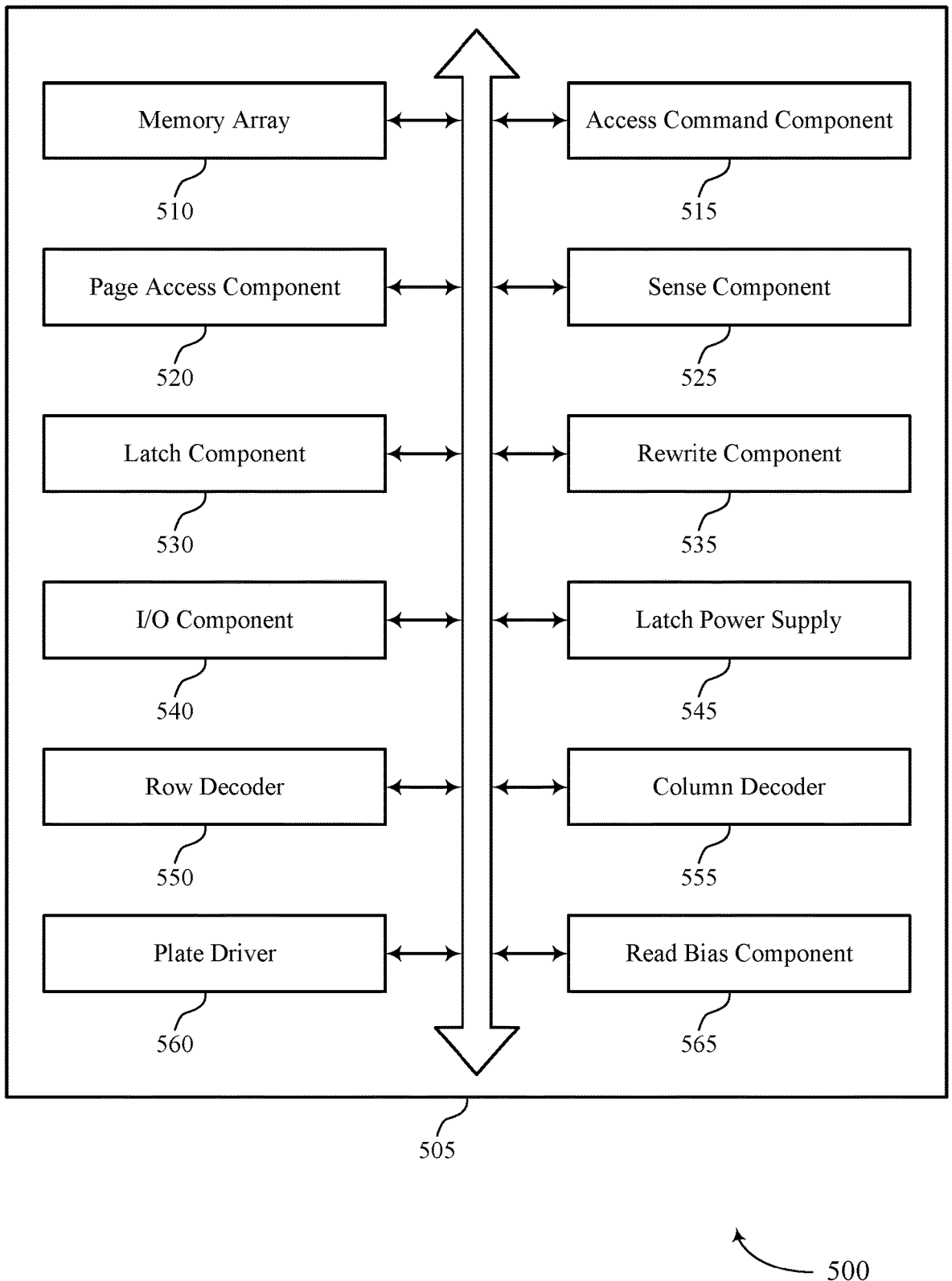
FIG. 5 shows a block diagram of a memory device that supports memory accessing with auto-precharge in accordance with aspects of the present disclosure.

FIG. 5 shows a block diagram 500 of a memory device 505 that supports memory accessing with auto-precharge in accordance with examples as disclosed herein. The memory device 505 may be an example of aspects of a memory device as described with reference to FIGS. 1 through 4B. The memory device 505 may include a memory array 510, an access command component 515, a page access component 520, a sense component 525, a latch component 530, a rewrite component 535, an I/O component 540, a latch power supply 545, a row decoder 550, a column decoder 555, a plate driver 560, and a read bias component 565. Each of these modules may communicate, directly or indirectly, with one another (e.g., via one or more buses).

The memory array 510 may include a plurality of memory cells, which may be organized for access according to rows or pages of memory cells. In some examples, selecting each of the memory cells of a page includes opening the memory array. In some examples, deselecting each of the memory cells of the page includes closing the memory array.

The access command component 515 may receive access commands (e.g., a first access command, a second access command, a third access command, a fourth access command, and so on) from a host device, or other device.

The page access component 520 may access a page of memory cells based on an access command. In some examples, accessing the page of memory cells may include the page access component 520 selecting each of the memory cells of the page, and deselecting each of the memory cells while respective logic states are stored at a respective sense amplifier latch. In some examples, accessing a second page of memory cells (e.g., based on a fourth access command) may include the page access component 520 selecting each of the memory cells of the second page and writing respective logic states of each of the memory cells to a respective memory cell of the second page.

The sense component 525 may sense a respective logic state of each of the memory cells (e.g., as part of accessing a page of memory cells).

The latch component 530 may store a respective logic state of each of the memory cells at a respective sense amplifier latch (e.g., as part of accessing a page of memory cells). In some examples, the latch component 530 may maintain the respective logic state of each of the memory cells at the respective sense amplifier latch until receiving another access command.

The rewrite component 535 may rewrite respective logic states of each of the memory cells to each of the respective memory cells.

The I/O component 540 may transmit (e.g., to a host device or other device), a respective logic state of each of the memory cells based on an access command (e.g., a second access command).

The latch power supply 545 may apply power to the set of sense amplifier latches based on the access command. In some examples, the latch power supply 545 may maintain the power at the set of sense amplifier latches until receiving a third access command. In some examples, the latch power supply 545 may remove the power from the set of sense amplifier latches based on the third access command.

The row decoder 550 may select a word line associated with a page of memory cells.

The column decoder 555 may select each of a set of digit lines associated with a page of memory cells.

The plate driver 560 may select one or more plate nodes associated with a page of memory cells.

The read bias component 565 may bias each of the memory cells of a page with a read bias based on selecting each of the memory cells of the page, or in response to a read command (e.g., an RD command).

Figure 6:
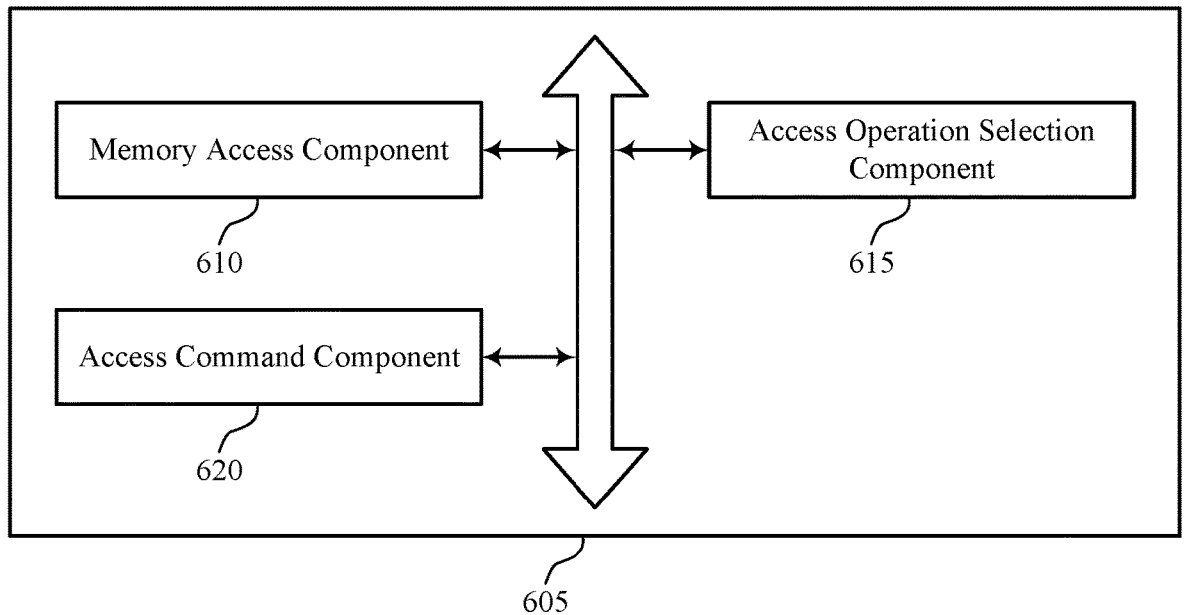
FIG. 6 shows a block diagram of a host device that supports memory accessing with auto-precharge in accordance with aspects of the present disclosure.

FIG. 6 shows a block diagram 600 of a host device 605 that supports memory accessing with auto-precharge in accordance with examples as disclosed herein. The host device 605 may be an example of aspects of a host device as described with reference to FIGS. 1 through 4B. The host device 605 may include a memory access component 610, an access operation selection component 615, and an access command component 620. Each of these modules may communicate, directly or indirectly, with one another (e.g., via one or more buses).

The memory access component 610 may determine to access a page of memory cells of a memory device that is coupled with the host device. In some examples, the memory access component 610 may determine to request the respective logic states from the memory device. In some examples, the memory access component 610 may determine to clear the respective logic states from the set of sense amplifier latches. In some examples, the memory access component 610 may determine to activate the page of memory cells before determining to request the respective logic states from the memory device. In some examples, the memory access component 610 may determine to store the respective logic states in a second page of memory cells of the memory device.

The access operation selection component 615 may select an access operation for accessing the memory device. In some examples, a selected access operation (e.g., a first access operation) may be associated with the memory device storing, after closing the page of memory cells, a respective logic state detected from each of the memory cells of the page in a respective sense amplifier latch of a set of sense amplifier latches of the memory device. In some cases, a selected access operation (e.g., a first access operation) may be associated with the memory device maintaining power at the set of sense amplifier latches until the memory device receives another access command.

In some examples, a selected access operation (e.g., a second access operation) may be associated with reading the respective logic states from the set of sense amplifier latches and transmitting the respective logic states to the host device.

In some examples, a selected access operation (e.g., a third access operation) may be associated with removing power from the set of sense amplifier latches.

In some examples, a selected access operation (e.g., a fourth access operation) may be associated with opening the second page of memory cells, writing the respective logic states to memory cells of the second page, and closing the second page of memory cells. In some cases, a selected access operation (e.g., a fourth access operation) may be associated with removing power from the set of sense amplifier latches.

The access command component 620 may transmit, to the memory device and based on selecting the access operation, an access command associated with the access operation.

Figure 7:
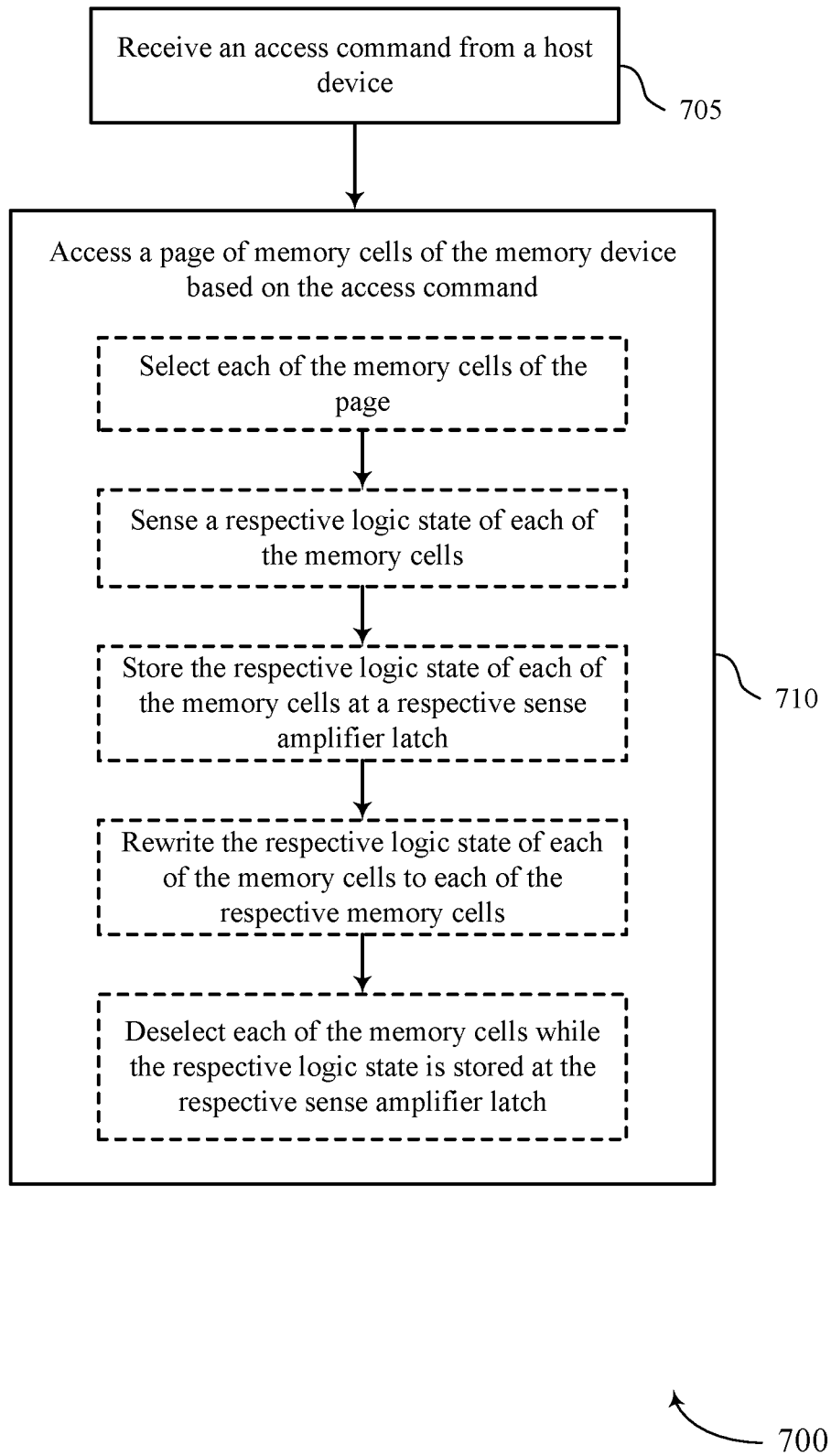
FIGS. 7 and 8 show flowcharts illustrating a method or methods that support memory accessing with auto-precharge in accordance with examples as disclosed herein.

FIG. 7 shows a flowchart illustrating a method or methods 700 that supports memory accessing with auto-precharge in accordance with aspects of the present disclosure. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may receive an access command from a host device, or other device. The operations of 705 may be performed according to the methods described herein. In some examples, aspects of the operations of 705 may be performed by an access command component as described with reference to FIG. 5.

At 710, the memory device may access a page of memory cells of the memory device based on the access command. In some examples, accessing the page of memory cells may include selecting each of the memory cells of the page, sensing a respective logic state of each of the memory cells, storing the respective logic state of each of the memory cells at a respective sense amplifier latch, rewriting the respective logic state of each of the memory cells to each of the respective memory cells, and deselecting each of the memory cells while the respective logic state is stored at the respective sense amplifier latch. The operations of 710 may be performed according to the methods described herein. In some examples, aspects of the operations of 710 may be performed by one or more of a page access component, a sense component, a latch component, or a rewrite component, as described with reference to FIG. 5.

In some examples, an apparatus as described herein may perform a method or methods, such as the method 700. The apparatus may include features, circuitry, means, or instructions (e.g., a non-transitory computer-readable medium storing instructions executable by a processor) for receiving, at a memory device, an access command from a host device, accessing, at the memory device, a page of memory cells of the memory device based on the access command, where accessing the page of memory cells includes sensing a respective logic state of each of the memory cells, storing the respective logic state of each of the memory cells at a respective sense amplifier latch, rewriting the respective logic state of each of the memory cells to each of the respective memory cells, and deselecting each of the memory cells while the respective logic state is stored at the respective sense amplifier latch.

Some examples of the method 700 and the apparatus described herein may further include operations, features, circuitry, means, or instructions for maintaining the respective logic state of each of the memory cells at the respective sense amplifier latch until receiving another access command.

Some examples of the method 700 and the apparatus described herein may further include operations, features, circuitry, means, or instructions for receiving, at the memory device, a second access command, and transmitting, to the host device, the respective logic state of each of the memory cells based on the second access command.

Some examples of the method 700 and the apparatus described herein may further include operations, features, circuitry, means, or instructions for applying power to the set of sense amplifier latches based on the access command, and maintaining the power at the set of sense amplifier latches until receiving a third access command.

Some examples of the method 700 and the apparatus described herein may further include operations, features, circuitry, means, or instructions for receiving, at the memory device, the third access command, and removing the power from the set of sense amplifier latches based on the third access command.

Some examples of the method 700 and the apparatus described herein may further include operations, features, circuitry, means, or instructions for receiving, at the memory device, a fourth access command, and accessing a second page of memory cells based on the fourth access command, where accessing the second page of memory cells includes selecting each of the memory cells of the second page and writing the respective logic state of each of the memory cells to a respective memory cell of the second page.

In some examples of the method 700 and the apparatus described herein, selecting each of the memory cells of the page may include operations, features, circuitry, means, or instructions for opening a memory array of the memory device, the memory array including the page of memory cells, and deselecting each of the memory cells of the page may include operations, features, circuitry, means, or instructions for closing the memory array of the memory device.

In some examples of the method 700 and the apparatus described herein, selecting each of the memory cells of the page may include operations, features, circuitry, means, or instructions for selecting a word line associated with the page of memory cells, selecting each of a set of digit lines associated with the page of memory cells, and selecting one or more plate nodes associated with the page of memory cells.

Some examples of the method 700 and the apparatus described herein may further include operations, features, circuitry, means, or instructions for biasing each of the memory cells of the page with a read bias based on selecting each of the memory cells of the page.

Figure 8:
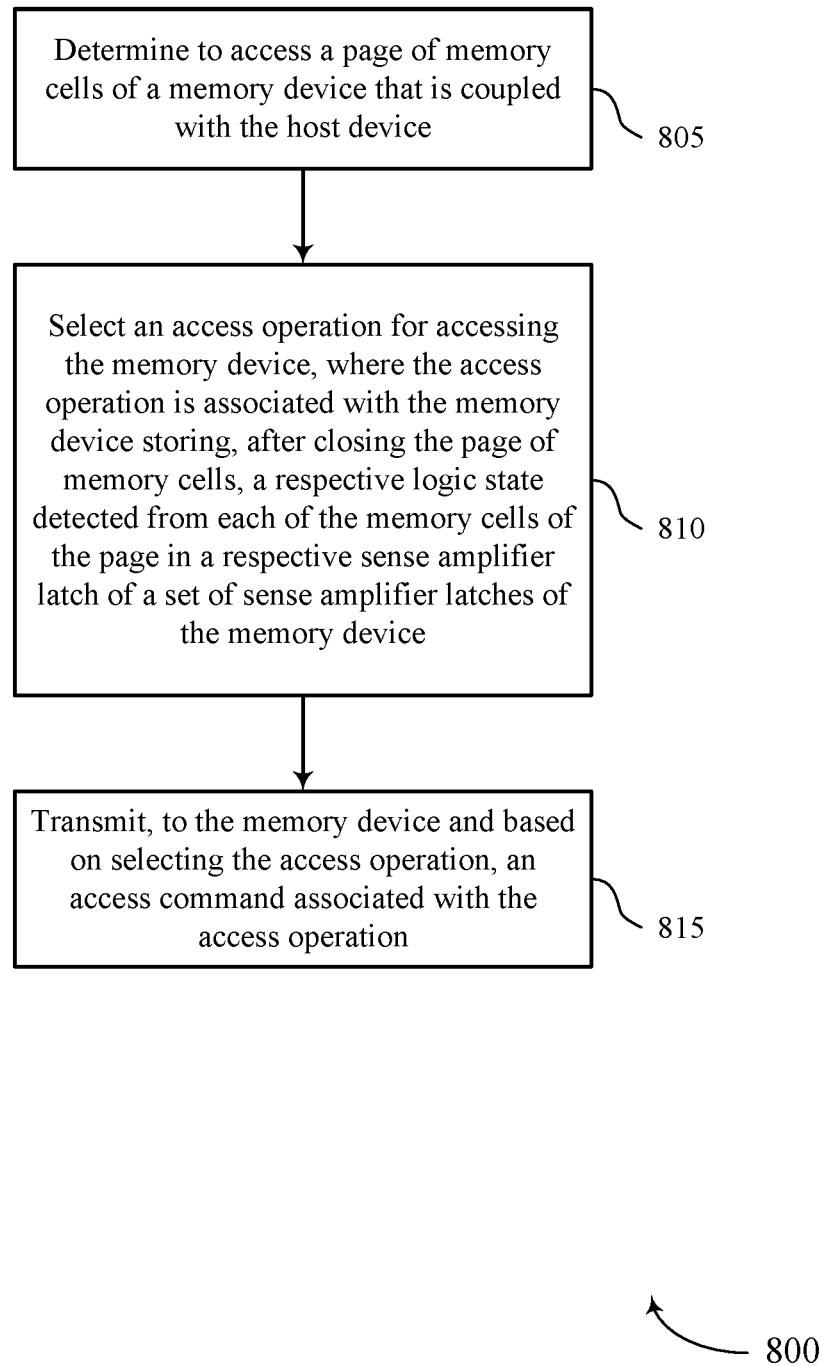

FIG. 8 shows a flowchart illustrating a method or methods 800 that supports memory accessing with auto-precharge in accordance with aspects of the present disclosure. The operations of method 800 may be implemented by a host device or its components as described herein. For example, the operations of method 800 may be performed by a host device as described with reference to FIG. 6. In some examples, a host device may execute a set of instructions to control the functional elements of the host device to perform the described functions. Additionally or alternatively, a host device may perform aspects of the described functions using special-purpose hardware.

At 805, the host device may determine to access a page of memory cells of a memory device that is coupled with the host device. The operations of 805 may be performed according to the methods described herein. In some examples, aspects of the operations of 805 may be performed by a memory access component as described with reference to FIG. 6.

At 810, the host device may select an access operation for accessing the memory device, where the access operation is associated with the memory device storing, after closing the page of memory cells, a respective logic state detected from each of the memory cells of the page in a respective sense amplifier latch of a set of sense amplifier latches of the memory device. The operations of 810 may be performed according to the methods described herein. In some examples, aspects of the operations of 810 may be performed by an access operation selection component as described with reference to FIG. 6.

At 815, the host device may transmit, to the memory device and based on selecting the access operation, an access command associated with the access operation. The operations of 815 may be performed according to the methods described herein. In some examples, aspects of the operations of 815 may be performed by an access command component as described with reference to FIG. 6.

In some examples, an apparatus as described herein may perform a method or methods, such as the method 800. The apparatus may include features, circuitry, means, or instructions (e.g., a non-transitory computer-readable medium storing instructions executable by a processor) for determining, at a host device, to access a page of memory cells of a memory device that is coupled with the host device, selecting an access operation for accessing the memory device, where the access operation is associated with the memory device storing, after closing the page of memory cells, a respective logic state detected from each of the memory cells of the page in a respective sense amplifier latch of a set of sense amplifier latches of the memory device, and transmitting, to the memory device and based on selecting the access operation, an access command associated with the access operation.

In some examples of the method 800 and the apparatus described herein, the access operation may be further associated with the memory device maintaining power at the set of sense amplifier latches until the memory device receives another access command.

Some examples of the method 800 and the apparatus described herein may further include operations, features, circuitry, means, or instructions for determining to request the respective logic states from the memory device, selecting a second access operation for accessing the memory device, where the second access operation is associated with reading the respective logic states from the set of sense amplifier latches and transmitting the respective logic states to the host device, and transmitting, to the memory device and based on selecting the second access operation, a second access command associated with the second access operation.

Some examples of the method 800 and the apparatus described herein may further include operations, features, circuitry, means, or instructions for determining to clear the respective logic states from the set of sense amplifier latches, selecting a third access operation for accessing the memory device, where the third access operation is associated with removing power from the set of sense amplifier latches, and transmitting, to the memory device and based on selecting the third access operation, a third access command associated with the third access operation.

In some examples of the method 800 and the apparatus described herein, selecting the access operation may include operations, features, circuitry, means, or instructions for determining to activate the page of memory cells before determining to request the respective logic states from the memory device (e.g., in a speculative access operation).

Some examples of the method 800 and the apparatus described herein may further include operations, features, circuitry, means, or instructions for determining to store the respective logic states in a second page of memory cells of the memory device, selecting a fourth access operation for accessing the memory device, where the fourth access operation is associated with opening the second page of memory cells, writing the respective logic states to memory cells of the second page, and closing the second page of memory cells, and transmitting, to the memory device and based on selecting the fourth access operation, a fourth access command associated with the fourth access operation.

In some examples of the method 800 and the apparatus described herein, the fourth access operation may be further associated with removing power from the set of sense amplifier latches.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array having a set of memory cells, a set of sense amplifier latches, and a memory controller. The memory controller may be operable to receive an access command from a host device or other requesting device, and access a page of memory cells of the memory array based at least in part on the access command. In some examples, accessing the page of memory cells based on the access command may include selecting each of the memory cells of the page, sensing a respective logic state of each of the memory cells, storing the respective logic state of each of the memory cells at a respective sense amplifier latch of the set of sense amplifier latches, rewriting the respective logic state of each of the memory cells to each of the respective memory cells, and deselecting each of the memory cells while the respective logic state is stored at the respective sense amplifier latch.

In some examples, the memory controller may be operable to maintain the respective logic state of each of the memory cells at the respective sense amplifier latch until receiving another access command.

In some examples, the memory controller may be operable to receive a second access command, and transmit, to the host device, the respective logic state of each of the memory cells based on the second access command.

In some examples, the memory controller may be operable to apply power to the set of sense amplifier latches based on the access command, and maintain the power at the set of sense amplifier latches until receiving a third access command. In some examples, the memory controller may be operable to receive the third access command, and remove the power from the set of sense amplifier latches based on the third access command.

In some examples, the memory controller may be operable to receive a fourth access command and access a second page of memory cells based on the fourth access command, where accessing the second page of memory cells includes selecting each of the memory cells of the second page and writing the respective logic state of each of the memory cells to a respective memory cell of the second page.

In some examples, the memory controller may be operable to select a word line associated with the page of memory cells, select each of a set of digit lines associated with the page of memory cells, and select one or more plate nodes associated with the page of memory cells.

In some examples, the memory controller may be operable to bias each of the memory cells of the page with a read bias based on selecting each of the memory cells of the page.

In some examples, each of the set of memory cells includes a volatile storage element.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
receiving, at a memory device, an access command from a host device; and
accessing, at the memory device, a page of memory cells of the memory device based at least in part on the access command, wherein accessing the page of memory cells comprises:
selecting each of the memory cells of the page;
sensing a respective logic state of each of the memory cells of the page;
storing the respective logic state of each of the memory cells of the page at a respective sense amplifier latch;
rewriting the respective logic state of each of the memory cells of the page to each of the respective memory cells of the page; and
deselecting, after rewriting the respective logic state to each of the respective memory cells of the page, each of the memory cells of the page while the respective logic state is stored at the respective sense amplifier latch;
applying power to the plurality of sense amplifier latches based at least in part on the access command; and
maintaining the power at the plurality of sense amplifier latches until receiving, at the memory device, a third access command.

2. The method of claim 1, further comprising:
maintaining the respective logic state of each of the memory cells of the page at the respective sense amplifier latch until receiving, at the memory device, another access command.

3. The method of claim 1, further comprising:
receiving, at the memory device, a second access command; and
transmitting, to the host device, the respective logic state of each of the memory cells of the page based at least in part on the second access command.

4. The method of claim 1, further comprising:
receiving, at the memory device, the third access command; and
removing the power from the plurality of sense amplifier latches based at least in part on the third access command.

5. The method of claim 1, further comprising:
receiving, at the memory device, a fourth access command; and
accessing a second page of memory cells based at least in part on the fourth access command, wherein accessing the second page of memory cells comprises:
selecting each of the memory cells of the second page; and
writing the respective logic state of each of the memory cells of the page to a respective memory cell of the second page.

6. The method of claim 1, wherein:
selecting each of the memory cells of the page comprises opening a memory array of the memory device, the memory array comprising the page of memory cells; and
deselecting each of the memory cells of the page comprises closing the memory array of the memory device.

7. The method of claim 1, wherein selecting each of the memory cells of the page comprises:
selecting a word line associated with the page of memory cells;
selecting each of a plurality of digit lines associated with the page of memory cells; and
selecting one or more plate nodes associated with the page of memory cells.

8. The method of claim 1, further comprising:
biasing each of the memory cells of the page with a read bias based at least in part on selecting each of the memory cells of the page.

9. An apparatus, comprising:
a memory array having a plurality of memory cells;
a plurality of sense amplifier latches; and
a memory controller operable to:
receive an access command from a host device; and
access a page of memory cells of the memory array based at least in part on the access command, wherein accessing the page of memory cells comprises:
selecting each of the memory cells of the page;
sensing a respective logic state of each of the memory cells of the page;
storing the respective logic state of each of the memory cells of the page at a respective sense amplifier latch of the plurality of sense amplifier latches;
rewriting the respective logic state of each of the memory cells of the page to each of the respective memory cells of the page; and
deselecting, after rewriting the respective logic state to each of the respective memory cells of the page, each of the memory cells of the page while the respective logic state is stored at the respective sense amplifier latch;
apply power to the plurality of sense amplifier latches based at least in part on the access command; and
maintain the power at the plurality of sense amplifier latches until receiving, at the memory array, a third access command.

10. The apparatus of claim 9, wherein the memory controller is operable to:
maintain the respective logic state of each of the memory cells of the page at the respective sense amplifier latch until receiving another access command.

11. The apparatus of claim 9, wherein the memory controller is operable to:
receive a second access command; and
transmit, to the host device, the respective logic state of each of the memory cells of the page based at least in part on the second access command.

12. The apparatus of claim 9, wherein the memory controller is operable to:
apply power to the plurality of sense amplifier latches based at least in part on the access command; and
maintain the power at the plurality of sense amplifier latches until receiving a third access command.

13. The apparatus of claim 12, wherein the memory controller is operable to:
receive the third access command; and
remove the power from the plurality of sense amplifier latches based at least in part on the third access command.

14. The apparatus of claim 9, wherein the memory controller is operable to:
receive a fourth access command; and access a second page of memory cells based at least in part on the fourth access command, wherein accessing the second page of memory cells comprises:
  selecting each of the memory cells of the second page; and
  writing the respective logic state of each of the memory cells of the page to a respective memory cell of the second page.

15. The apparatus of claim 9, wherein, to select each of the memory cells of the page, the memory controller is operable to:
  select a word line associated with the page of memory cells;
  select each of a plurality of digit lines associated with the page of memory cells; and
  select one or more plate nodes associated with the page of memory cells.

16. The apparatus of claim 9, wherein the memory controller is operable to:
  bias each of the memory cells of the page with a read bias based at least in part on selecting each of the memory cells of the page.

17. The apparatus of claim 9, wherein each of the plurality of memory cells comprises a volatile storage element.

18. A method, comprising:
  determining, at a host device, to access a page of memory cells of a memory device that is coupled with the host device;
  selecting an access operation for accessing the memory device, wherein the access operation is associated with the memory device storing a respective logic state detected from each of the memory cells of the page, in a respective sense amplifier latch of a plurality of sense amplifier latches of the memory device, after rewriting the respective logic state to each of the respective memory cells of the page;
  transmitting, to the memory device and based at least in part on selecting the access operation, an access command associated with the access operation, wherein the access operation is further associated with the memory device maintaining power at the plurality of sense amplifier latches until the memory device receives another access command;
  determining to clear the respective logic states from the plurality of sense amplifier latches;
  selecting a third access operation for accessing the memory device, wherein the third access operation is associated with removing power from the plurality of sense amplifier latches; and
  transmitting, to the memory device and based at least in part on selecting the third access operation, a third access command associated with the third access operation.

19. The method of claim 18, further comprising:
  determining to request the respective logic states from the memory device;
  selecting a second access operation for accessing the memory device, wherein the second access operation is associated with reading the respective logic states from the plurality of sense amplifier latches and transmitting the respective logic states to the host device; and
  transmitting, to the memory device and based at least in part on selecting the second access operation, a second access command associated with the second access operation.

20. The method of claim 18, wherein selecting the access operation comprises:
  determining to activate the page of memory cells before determining to request the respective logic states from the memory device.

21. The method of claim 18, further comprising:
  determining to store the respective logic states in a second page of memory cells of the memory device;
  selecting a fourth access operation for accessing the memory device, wherein the fourth access operation is associated with opening the second page of memory cells, writing the respective logic states to memory cells of the second page, and closing the second page of memory cells; and
  transmitting, to the memory device and based at least in part on selecting the fourth access operation, a fourth access command associated with the fourth access operation.

22. The method of claim 21, wherein the fourth access operation is further associated with removing power from the plurality of sense amplifier latches.

23. The method of claim 18, wherein the access operation is further associated with the memory device applying power to the plurality of sense amplifier latches based at least in part on the access command and maintaining the power at the plurality of sense amplifier latches until receiving, at the memory device, a second access command.

* * * * *